United States Patent
Zhang et al.

(10) Patent No.: US 11,035,346 B2
(45) Date of Patent: Jun. 15, 2021

(54) METHOD AND DEVICE FOR PREDICTING WIND TURBINE FAULT

(71) Applicant: XINJIANG GOLDWIND SCIENCE & TECHNOLOGY CO., LTD., Xinjiang (CN)

(72) Inventors: Guanglei Zhang, Beijing (CN); Yuan Liu, Beijing (CN); Jie Zhou, Beijing (CN)

(73) Assignee: XINJIANG GOLDWIND SCIENCE & TECHNOLOGY CO., LTD., Xinjiang (CN)

(*) Notice: Subject to any disclaimer, the term of this patent is extended or adjusted under 35 U.S.C. 154(b) by 603 days.

(21) Appl. No.: 15/777,065

(22) PCT Filed: Oct. 10, 2017

(86) PCT No.: PCT/CN2017/105440
§ 371 (c)(1),
(2) Date: May 17, 2018

(87) PCT Pub. No.: WO2018/171165
PCT Pub. Date: Sep. 27, 2018

(65) Prior Publication Data
US 2020/0309099 A1 Oct. 1, 2020

(30) Foreign Application Priority Data
Mar. 24, 2017 (CN) .......................... 201710180903.6

(51) Int. Cl.
*F03D 17/00* (2016.01)
*F03D 7/02* (2006.01)
*G01R 31/34* (2020.01)

(52) U.S. Cl.
CPC ............ *F03D 17/00* (2016.05); *F03D 7/0292* (2013.01); *G01R 31/343* (2013.01); *F05B 2260/84* (2013.01)

(58) Field of Classification Search
CPC ..... F03D 7/0292; F03D 17/00; G01R 31/343; F05B 2260/84
(Continued)

(56) References Cited

U.S. PATENT DOCUMENTS 8,082,115 B2 * 12/2011 Bechhoefer ............ F03D 17/00
702/34
8,442,778 B2 * 5/2013 Bechhoefer ............ F03D 7/047
702/34
(Continued)

FOREIGN PATENT DOCUMENTS

| CN | 102721924 A | 10/2012 |
| CN | 102778358 A | 11/2012 |

(Continued)

OTHER PUBLICATIONS

International Search Report dated Jan. 12, 2018; PCT/CN2017/105440 English Translation not yet available from WIPO.
(Continued)

*Primary Examiner* — Pedro J Cuevas

(57) ABSTRACT

A method and device for predicting a wind turbine fault is provided. The method includes: initializing a wind turbine model of the wind turbine; updating wind turbine model parameters of the wind turbine model based on a current environment condition and current actual wind turbine state parameters of the wind turbine periodically; establishing a variation model of the wind turbine model parameter based on historical wind turbine model parameters and corresponding historical environment conditions; predicting the wind turbine model parameters at a future moment by using the variation model of the wind turbine model parameters
(Continued)

based on a future environment condition at the future moment; establishing a wind turbine fault model based on the historical wind turbine model parameters and corresponding historical wind turbine faults; predicting the wind turbine fault at the future moment based on the predicted wind turbine model parameters and the wind turbine fault model.

20 Claims, 2 Drawing Sheets

(58) Field of Classification Search
USPC .................................................. 290/44, 55
See application file for complete search history.

(56) References Cited

U.S. PATENT DOCUMENTS

| | | | | |
|---|---|---|---|---|
| 9,529,057 | B2* | 12/2016 | Shrestha | H02H 1/0092 |
| 9,897,516 | B2* | 2/2018 | Bechhoefer | F03D 17/00 |
| 10,768,072 | B2* | 9/2020 | Bechhoefer | G01M 13/00 |
| 2011/0125419 | A1* | 5/2011 | Bechhoefer | F03D 7/047 |
| | | | | 702/34 |
| 2012/0065901 | A1* | 3/2012 | Bechhoefer | G05B 23/0283 |
| | | | | 702/34 |
| 2012/0143565 | A1 | 6/2012 | Graham, III et al. | |
| 2013/0073223 | A1 | 3/2013 | Lapira et al. | |
| 2014/0032138 | A1* | 1/2014 | Shrestha | G06F 11/30 |
| | | | | 702/58 |
| 2014/0163904 | A1* | 6/2014 | Bechhoefer | G05B 23/0283 |
| | | | | 702/34 |
| 2014/0324495 | A1 | 10/2014 | Zhou et al. | |
| 2015/0154504 | A1 | 6/2015 | Zhang et al. | |
| 2016/0010628 | A1 | 1/2016 | Dhar et al. | |
| 2016/0034856 | A1 | 2/2016 | Son | |
| 2017/0016430 | A1 | 1/2017 | Swaminathan et al. | |
| 2017/0023438 | A1* | 1/2017 | Bechhoefer | G05B 23/0283 |
| 2018/0120200 | A1* | 5/2018 | Bechhoefer | G01M 13/00 |

FOREIGN PATENT DOCUMENTS

| | | |
|---|---|---|
| CN | 102567636 B | 1/2015 |
| CN | 105508149 A | 4/2016 |
| CN | 106951997 A | 7/2017 |

OTHER PUBLICATIONS

Extended European Search Report dated Apr. 3, 2019; Appln. No. 17875063.4.
First Examination Report of Indian Application No. 201817021552; dated Feb. 12, 2021.

* cited by examiner

METHOD AND DEVICE FOR PREDICTING WIND TURBINE FAULT

CROSS REFERENCE TO RELATED APPLICATIONS

This application is a national phase of International Application No. PCT/CN2017/105440, titled "METHOD AND DEVICE FOR PREDICTING WIND TURBINE FAULT", filed on Oct. 10, 2017, which claims priority to Chinese Patent Application No. 201710180903.6 titled "METHOD AND DEVICE FOR PREDICTING WIND TURBINE FAULT" and filed with the Chinese State Intellectual Property Office on Mar. 24, 2017, both of which are incorporated herein by reference in their entirety.

TECHNICAL FIELD

The present disclosure relates to the field of wind energy, and particularly to a method and a device for predicting a wind turbine fault.

BACKGROUND

The wind energy is being more and more highlighted as a clean renewable energy source, and the installed capacity of the wind energy device (i.e. wind turbines) is ever-increasing. Wind turbines may be various devices drove by utilizing the wind energy, such as wind generator devices, windmills and other devices drove by the wind energy.

Wind turbines generally run in the wild and other natural condition, which has a high maintenance cost. Therefore, predicting the wind turbine fault in advance can effectively make the possible fault of the wind turbine be learned in advance, thereby taking action to prevent the fault from happening in advance.

Therefore, a technology that can accurately predict the wind turbine fault is required.

SUMMARY

A method and a device which can accurately predict a wind turbine fault are provided according to the present application.

According to an aspect of the present application, a method for predicting a wind turbine fault is provided, which includes: initializing a wind turbine model of the wind turbine; updating wind turbine model parameters of the wind turbine model based on a current environment condition and current actual wind turbine state parameters of the wind turbine periodically; establishing a variation model of the wind turbine model parameter based on historical wind turbine model parameters and corresponding historical environment conditions; predicting wind turbine model parameters at a future moment by using the variation model of the wind turbine model parameters based on a future environment condition at the future moment; establishing a wind turbine fault model based on the historical wind turbine model parameters and corresponding historical wind turbine faults; predicting the wind turbine fault at the future moment based on the predicted wind turbine model parameters and the wind turbine fault model.

According to another aspect of the present application, a device for predicting a wind turbine fault is provided, which includes: an initialization unit configured to initialize a wind turbine model of a wind turbine; a parameter updating unit configured to update wind turbine model parameters of the wind turbine model based on a current environment condition and current actual wind turbine state parameters of the wind turbine periodically; a parameter modeling unit configured to establish a variation model of the wind turbine model parameters based on historical wind turbine model parameters and corresponding historical environment conditions; a parameter prediction unit configured to predict the wind turbine model parameters at a future moment by using the variation model of the wind turbine model parameters based on a future environment condition at the future moment; a fault modeling unit configured to establish a wind turbine fault model based on the historical wind turbine model parameters and corresponding historical wind turbine faults; a fault prediction unit configured to predict the wind turbine fault at the future moment based on the predicted wind turbine model parameters and the wind turbine fault model.

According to another aspect of the present application, a system for predicting a wind turbine fault is provided, which includes: a processor; and a memory storing computer-readable codes that, when executed by the processor, configures the processor to perform the above method.

According to another aspect of the present application, a computer-readable storage medium storing computer-readable codes is provided. The computer-readable codes, when executed, cause the above method to be performed.

According to a method and a device for predicting a wind turbine fault provided according to the present application, the influence of environmental factors on the wind turbine operation state is fully taken into account when predicting the wind turbine fault. Considering the specific relationship between the wind turbine and the environmental factors, the wind turbine model is established based on the influence of the environmental factors. Meanwhile, wind turbine model parameters are updated constantly to obtain historical wind turbine model parameters. And a variation model of the wind turbine model parameters is established, through which state changes of the wind turbine may be predicted under any environment condition. Based on the variation model of the wind turbine model parameters, the wind turbine fault model related to the wind turbine model parameters is further established, to predict the fault, thereby predicting the wind turbine fault more accurately.

BRIEF DESCRIPTION OF THE DRAWINGS

The above and other purpose, the features and the advantages of the present application will be more apparent through the detailed description in conjunction with the drawings hereinafter.

DETAILED DESCRIPTION OF EMBODIMENTS

Various exemplary embodiments are to be described more fully with reference to the drawings.

Figure 1:
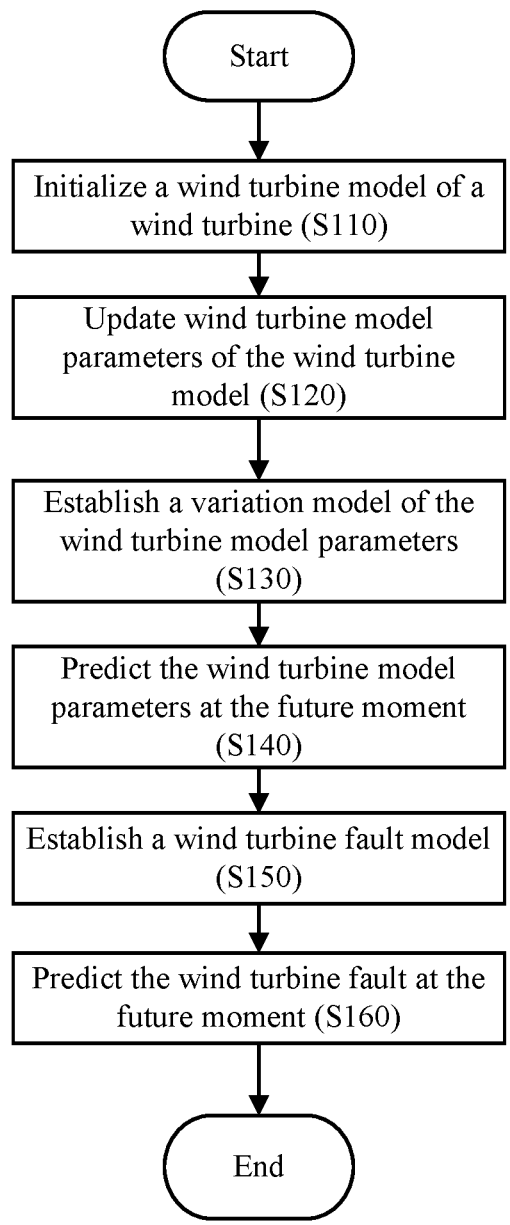
FIG. 1 shows a flow chart of a method for predicting a wind turbine fault according to an embodiment of the present application.

FIG. 1 shows a flow chart of a method for predicting a wind turbine fault according to an embodiment of the present application.

Reference is made to FIG. 1, in step S110, a wind turbine model of a wind turbine is initialized.

The wind turbine model reflects a relationship between an environment condition where the wind turbine is located and state parameters of the wind turbine (hereinafter called wind turbine state parameters). According to the embodiment of the present application, the wind turbine model may estimate and output the corresponding wind turbine state parameters by inputting the environment condition into the wind turbine model.

The wind turbine model may be established by acquiring measured environment conditions and measured wind turbine state parameters. Moreover, an empirical model may be used as the wind turbine model. Various modeling technologies may be used to establish the wind turbine model, which are not limited herein, as long as the established wind turbine model may reflects the interrelationship between environment conditions and wind turbine state parameters.

The environment condition of the wind turbine is environment factors which influence the operating state of the wind turbine.

The environment condition may include (but not limited to) at least one of: wind speed, temperature, humidity, air density, etc. Various sensors used for detecting the environment condition are used to measure the environment condition actually.

The wind turbine state parameters may include (but not limited to) at least one of: a current rotation speed, a yaw direction, a pitch angle, an output power, etc. For example, in a case where the wind turbine is a wind generator, the wind turbine state parameters may further include generation power and other electrical parameters.

Initial wind turbine model parameters are determined based on an initial environment condition and initial actual wind turbine state parameters. According to the embodiment of the present application, when initializing the wind turbine model, the current environment condition is acquired as the initial environment condition, and the actual wind turbine state parameters are detected as the initial actual wind turbine state parameters. Under such condition, the wind turbine model parameters are initialized based on the initial environment condition and the initial actual wind turbine state parameters, thereby determining the initial wind turbine model parameters. In the embodiment of the present application, in a case where an initial input and an expected output of the wind turbine model are determined, the wind turbine model parameters are determined.

In this case, the initial wind turbine model parameters enable the wind turbine state parameters outputted by the wind turbine model into which the initial environment condition is inputted to be as close to the initial actual wind turbine state parameters as possible.

In a preferable embodiment, when determining the initial wind turbine model parameters, the initial wind turbine model parameters themselves are further considered. In this case, the initial wind turbine model parameters enable the wind turbine state parameters outputted by the wind turbine model into which the initial environment condition is inputted to be as close to the initial actual wind turbine state parameters as possible, meanwhile, a weighted result of a total value of the initial wind turbine model parameters is as small as possible. Herein, the total value of the initial wind turbine model parameters may be expressed as a sum of absolute values of each initial wind turbine model parameter, or a sum of even powers of each initial wind turbine model parameter (it should be understood that in a case where there is only one (i.e. one type) wind turbine model parameter of the wind turbine model, the sum mentioned herein is the absolute value or the even power of the one initial wind turbine model parameter). The weights used for weighting may be acquired empirically or experimentally. For example, the wind turbine model parameters enabling a sum of the "the change of the wind turbine state parameters outputted by the wind turbine model into which the initial environment condition is inputted with respect to the initial actual wind turbine state parameters" and the "the weighted result of the total value of the initial wind turbine model parameters" to be minimized as the initial wind turbine model parameters.

In the preferable embodiment, the initial actual wind turbine state parameters are acquired through the following formula (1):

$$\min_{\theta_0}\{[y_0 - f_0(x_0)]^T[y_0 - f_0(x_0)] + \alpha \cdot \theta_0^T \cdot \theta_0\} \quad (1)$$

$x_0$ represents the initial environment condition, $y_0$ represents the initial actual wind turbine state parameters, $f_0(x_0)$ represents the wind turbine state parameters outputted by the wind turbine model into which the initial environment condition is inputted, $\theta_0$ represents the initial wind turbine model parameters, $\alpha$ represents normalization weight coefficients, $$\min_{\theta_0}$$

{ } represents to acquire $\theta_0$ enabling the formula in the bracket to be minimized. The normalization weight coefficients $\alpha$ may be acquired empirically or experimentally. It should be understood that $\theta_0^{TSM}\theta_0$ represents the total value of the initial wind turbine model parameters mentioned above.

In step S120, wind turbine model parameters of the wind turbine model are updated periodically based on a current environment condition and current actual wind turbine state parameters of the wind turbine.

According to the embodiment of the present application, after the wind turbine model is initialized, the updated wind turbine model parameters may be periodically acquired, based on the current environment condition and the wind turbine's current actual wind turbine state parameters, as the wind turbine model parameters for the current period. As a result, the wind turbine model may be kept accurate, and the historical wind turbine model parameters and the corresponding historical environment conditions thereof may be collected.

In each period, the current environment condition and the wind turbine's current actual wind turbine state parameters are acquired, thereby determining the wind turbine model parameters for each period in a case where the initial input and the expected output of the wind turbine model are determined.

The updated wind turbine model parameters enable the wind turbine state parameters outputted by the wind turbine model into which the current environment condition is inputted to be as close to the current actual wind turbine state parameters as possible. According to the embodiment of the present application, the initial wind turbine model parameters enable that the difference between the wind turbine state parameters outputted by the wind turbine model into which the current environment condition is inputted and the current actual wind turbine state parameters is minimized.

In a preferable embodiment, the variation of the wind turbine model parameters is further considered when updating the wind turbine model parameters in each period. In this case, during each period, the updated wind turbine model parameters enable the wind turbine state parameters outputted by the wind turbine model into which the current environment condition is inputted to be as close to current actual wind turbine state parameters as possible, meanwhile, the weighted result of the variation of the updated wind turbine model parameters relative to the last updated wind turbine model parameters (i.e. the wind turbine model parameters updated in the last period) is as small as possible. In the embodiment of the present application, the updated wind turbine model parameters enable the difference between the wind turbine state parameters outputted by the wind turbine model into which the current environment condition is inputted and the current actual wind turbine state parameters is minimized, meanwhile, the difference between the updated wind turbine model parameters and the last updated wind turbine model parameters is minimized. For example, the wind turbine model parameters enabling the sum of "the variation of the wind turbine state parameters outputted by the wind turbine model into which the current environment condition is inputted with respect to the current actual wind turbine state parameters" and "the weighted result of the variation of the updated wind turbine model parameters relative to the last updated wind turbine model parameters" to be minimized may be acquired as the updated wind turbine model parameters.

Herein, the sum of the absolute values or the even powers of the difference values between each updated wind turbine model parameter and each last updated wind turbine model parameter with the same type may be calculated as the variation (it should be understood that in a case where the wind turbine model only has one (i.e. one type) wind turbine model parameter, the sum mentioned above is the absolute value or the even power of the difference value of the wind turbine model parameter of the type). The weights used for weighting may be acquired empirically or experimentally.

In the preferable embodiment, the updated wind turbine model parameters are acquired through the following formula (2):

$$\min_{\theta_t}\{[y_t - f_t(x_t)]^T[y_t - f_t(x_t)] + \alpha \cdot (\theta_t - \theta_{t-1})^T(\theta_t - \theta_{t-1})\} \quad (2)$$

$x_t$ represents the current environment condition, $y_t$ represents the current actual wind turbine state parameters, $f_t(x_t)$ represents the wind turbine state parameters outputted by the wind turbine model into which the current environment condition is inputted, $\theta_t$ represents the updated wind turbine model parameters, $\theta_{t-1}$ represents the last updated wind turbine model parameters, $\alpha$ represents normalization weight coefficients, $$\min_{\theta_t}$$

{ } represents to acquire $\theta_t$ enabling the formula in the bracket to be minimized.

It should be understood that $(\theta_t - \theta_{t-1})^T(\theta_t - \theta_{t-1})$ represents the variation of the mentioned updated wind turbine model parameters relative to the last updated wind turbine model parameters.

In step S130, a variation model of the wind turbine model parameters is established based on historical wind turbine model parameters and corresponding historical environment conditions.

The variation model of the wind turbine model parameters represents the relationship between environment conditions and wind turbine model parameters. In the embodiment of the present application, when inputting the environment condition into the variation model of the wind turbine model parameters, the variation model of the wind turbine model parameters may estimate and output corresponding wind turbine model parameters. Based on the historical wind turbine model parameters and the corresponding historical environment conditions, the variation model of the wind turbine model parameters may be established by using various modeling technologies, which are not limited herein, as long as the established variation model of the wind turbine model parameters may represents the interrelation between the environment conditions and the wind turbine model parameters.

In an embodiment, the variation model of the wind turbine model parameters is established by fitting with the historical wind turbine model parameters and the corresponding historical environment conditions. The variation model of the wind turbine model parameters may be fit out through various fitting methods. Moreover, the structure of the variation model of the wind turbine model parameters may be acquired through fitting (in this case, the structure and the parameters of the variation model of the wind turbine model parameters are determined through fitting) or may be pre-determined (in this case, only the parameters of the variation model of the wind turbine model parameters are determined through fitting).

In a preferable embodiment, the variation model of the wind turbine model parameters is expressed as the following formula (3):

$$\theta_T = A \cdot \theta_{T-1} + B \cdot x_T \quad (3)$$

$\theta_T$ represents the wind turbine model parameters at time T, $\theta_{T-1}$ represents the wind turbine model parameters at time T−1, A is a state-transition matrix of the wind turbine model parameters, B is the influence-coefficient-matrix of environment condition on the wind turbine model parameters, $x_T$ is the environment condition at the time T. It should be understood that time T−1 represents the wind turbine model parameters at a time after the time T.

It should be understood that the parameters A and B may be acquired though fitting.

When predicting the wind turbine model parameters at a moment in the future by using the formula (3), in an embodiment, the time T represents the moment in the future, and the time T−1 represents the current moment of predicting the wind turbine model parameters or the fault; in another embodiment, the environment condition(s) at one or more moments (called the intermediate moment) between the current moment and the moment in the future may be acquired, and, from the current time, by using the environment condition at a later moment of two adjacent moments and the wind turbine model parameters at a preceding moment of the two adjacent moments, the wind turbine model parameters at the later time is predicted according to formula (3) until the wind turbine model parameters at the moment in the future is predicted. For example, in a case where the environment conditions at two intermediate moments are acquired, by using the environment condition at a first intermediate time and the wind turbine model parameters at the current moment, the wind turbine model parameters at the first intermediate time are predicted; by using the environment condition at a second intermediate time and the predicted wind turbine model parameters at the first intermediate time, the wind turbine model parameters at the second time are predicted; by using the environment condition at the moment in the future and the predicted wind turbine model parameters at the second time, the wind turbine model parameters at the moment in the future are predicted.

It should be understood that the structure of the variation model of the wind turbine model parameters is not limited to the function structure expressed in formula (3), which may be determined through the fitting process or adopts other structures.

The historical wind turbine model parameters and the corresponding historical environment conditions may be acquired based on step S120. The historical wind turbine model parameters and the corresponding historical environment conditions may represents the wind turbine model parameters and the corresponding environment condition for each period in the past time acquired based on step S120 or all of the wind turbine model parameters and the corresponding environment conditions acquired based on steps S110 and S120.

In step S140, based on the future environment condition at the future moment, the variation model of the wind turbine model parameters is used to predict the wind turbine model parameters at the future moment.

In a case where it is expected to predict the wind turbine fault at the future moment (i.e. a moment in the future), the environment condition at the future moment (hereinafter, it is called future environment condition) may be acquired, and the acquired future environment condition is inputted into the variation model of the wind turbine model parameters to predict the wind turbine model parameters at the future moment.

The environment condition at the future moment may be acquired through various methods, such as weather forecasts, environmental models, etc. The present application does not limit the method for acquiring the environment condition at the future moment.

In step S150, a wind turbine fault model is established based on the historical wind turbine model parameters and corresponding historical wind turbine faults. The wind turbine fault model represents the relationship between wind turbine model parameters and wind turbine faults. In the embodiment of the present application, when inputting the wind turbine model parameters into the wind turbine fault model, the wind turbine fault model may estimate and output the corresponding wind turbine fault.

The wind turbine fault model may be established by using various modeling technologies based on the historical wind turbine model parameters and the corresponding historical wind turbine faults, which is not limited in the present application, as long as the established wind turbine fault model may represents the relationship between the wind turbine model parameters and the wind turbine faults.

When the wind turbine fails, the wind turbine model parameters of the current wind turbine model are acquired, thereby obtaining the historical wind turbine model parameters and the corresponding historical wind turbine fault. In the embodiment of the present application, "the historical wind turbine fault" indicates whether a fault has happened. In this case, the acquired wind turbine fault model may output information indicating whether the fault has happened based on the inputted wind turbine model parameters. For example, the wind turbine model parameters may be used as features and whether a fault has happened is taken as classification tag, and the historical wind turbine model parameters and the corresponding historical wind turbine faults are used as training samples to train a classifier to be the wind turbine fault model. As the result, the wind fault model is the classifier with the features of the wind turbine model parameters and the classification tag of whether the fault has happened.

Moreover, when the wind turbine fails, fault type may be acquired. In the embodiment of the present application, "the historical wind turbine fault" herein may indicate the fault type. In this case, if the fault is predicted, the wind turbine fault model may output information indicating the type of the happened fault. For example, the wind turbine model parameters may be used as the features and the fault type may be used as the classification tag, the historical wind turbine model parameters and the corresponding historical wind turbine faults are used as training samples to train a classifier to be the wind turbine fault model. As the result, the wind turbine fault model is the classifier with the features of the wind turbine model parameters and the classification tag of the fault type.

Preferably, the historical wind turbine model parameters and the corresponding historical wind turbine faults used in establishing the wind turbine fault model may be the historical wind turbine model parameters and the corresponding historical wind turbine faults which have been collected so far when predicting the wind turbine fault each time.

In step S160, the wind turbine fault at the future moment is predicted based on the predicted wind turbine model parameters and the wind turbine fault model.

After the wind turbine model parameters at the future moment are acquired in step S140, the acquired wind turbine model parameters are inputted into the established wind turbine fault model, so that the wind turbine fault model predicts the wind turbine fault at the future moment. Based on the different wind turbine fault models mentioned above, the predicted fault may only indicate whether the fault has happened or the type of the fault.

It should be understood that the execution sequence of steps S130 and S150 and the execution sequence of steps S140 and S150 may be exchanged or performed simultaneously. Besides, steps S130 and S150 may be performed when it is determined to predict the wind turbine fault for modeling based on the latest data. Furthermore, steps S130 and S150 may be performed in advance for modeling in advance.

Figure 2:
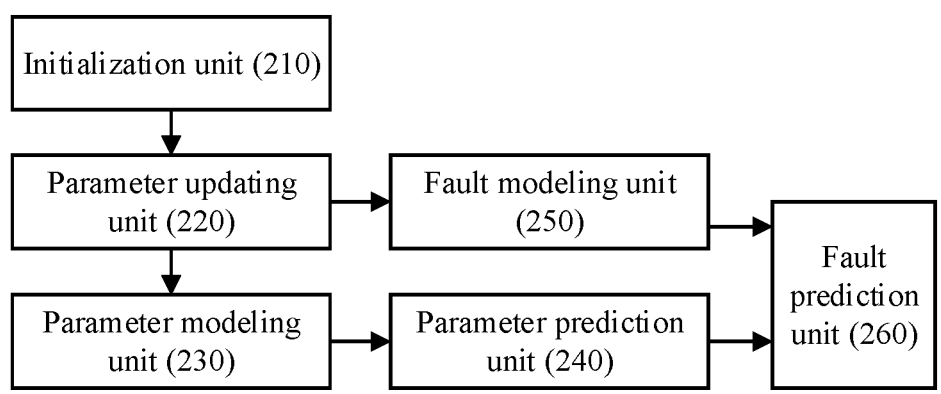
FIG. 2 shows a block diagram of a device for predicting a wind turbine fault according to an embodiment of the present application.

Reference is made to FIG. 2. A device for predicting a wind turbine fault according to an embodiment of the present application is described hereinafter.

FIG. 2 shows a block diagram of a device for predicting a wind turbine fault according to an embodiment of the present application.

As shown in FIG. 2, a device 200 for predicting the wind turbine fault provided according to the embodiment of the present application includes an initialization unit 210, a parameter updating unit 220, a parameter modeling unit 230, a parameter prediction unit 240, a fault modeling unit 250 and a fault prediction unit 260.

The initialization unit 210 initializes a wind turbine model of a wind turbine.

The wind turbine model reflects a relationship between an environment condition where the wind turbine is located and state parameters of the wind turbine (hereinafter called the wind turbine state parameters). According to the embodiment of the present application, the wind turbine model may estimate and output the corresponding wind turbine state parameters when inputting the environment condition into the wind turbine model.

The wind turbine model may be established by acquiring measured environment conditions and measured wind turbine state parameters. Moreover, an empirical model may be used as the wind turbine model. Various modeling technologies may be used to establish the wind turbine model, which are not limited herein, as long as the established wind turbine model may reflects the interrelationship between environment conditions and wind turbine state parameters.

The environment condition of the wind turbine is environment factors which influence the operating state of the wind turbine.

The environment condition may include (but not limited) at least one of: wind speed, temperature, humidity, air density, etc. Various sensors used for detecting the environment condition are used to measure the environment condition actually.

The wind turbine state parameters may include (but not limited to) at least one of: a current rotation speed, a yaw direction, a pitch angle, an output power, etc. For example, in a case where the wind turbine is a wind generator, the wind turbine state parameters may further include generation power and other electrical parameters.

The initialization unit 210 may determine initial wind turbine model parameters based on an initial environment condition and initial actual wind turbine state parameters. According to the embodiment of the present application, when initializing the wind turbine model, the current environment condition is acquired as the initial environment condition, and the actual wind turbine state parameters are detected as the initial actual wind turbine state parameters. Under such condition, the initialization unit 210 initializes the wind turbine model parameters based on the initial environment condition and the initial actual wind turbine state parameters, thereby determining the initial wind turbine model parameters. In the embodiment of the present application, in a case where an initial input and an expected output of the wind turbine model are determined, the wind turbine model parameters are determined.

In this case, the initial wind turbine model parameters enable the wind turbine state parameters outputted by the wind turbine model into which the initial environment condition is inputted to be as close to the initial actual wind turbine state parameters as possible. According to the embodiment of the present application, the initial wind turbine model parameters enables the difference between the wind turbine state parameters outputted by the wind turbine model into which the current environment condition is inputted and the current actual wind turbine state parameters to be minimized.

In a preferable embodiment, when determining the initial wind turbine model parameters, the initial wind turbine model parameters themselves are further considered. In this case, the initial wind turbine model parameters enable the wind turbine state parameters outputted by the wind turbine model into which the initial environment condition is inputted to be as close to the initial actual wind turbine state parameters as possible, meanwhile, a weighted result of a total value of the initial wind turbine model parameters is as small as possible. According to the embodiment of the present application, the updated wind turbine model parameters enable the difference between the wind turbine state parameters outputted by the wind turbine model into which the current environment condition is inputted and the current actual wind turbine state parameters to be minimized, meanwhile, the difference between the updated wind turbine model parameters and the last updated wind turbine model parameters is minimized. For example, the wind turbine model parameters enabling the sum of "the variation of the wind turbine state parameters outputted by the wind turbine model into which the current environment condition is inputted with respect to the current actual wind turbine state parameters" and "the weighted result of the variation of the updated wind turbine model parameters relative to the last updated wind turbine model parameters" to be minimized may be acquired as the updated wind turbine model parameters.

Herein, the total value of the initial wind turbine model parameters may be expressed as a sum of absolute values of each initial wind turbine model parameter, or a sum of even powers of each initial wind turbine model parameter (it should be understood that in a case where there is only one (i.e. one type) wind turbine model parameter of the wind turbine model, the sum mentioned herein is the absolute value or the even power of the one type of wind turbine model parameters). The weights used for weighting may be acquired empirically or experimentally.

The parameter updating unit 220 periodically updates wind turbine model parameters of the wind turbine model based on a current environment condition and current actual wind turbine state parameters of the wind turbine.

According to the embodiment of the present application, after the wind turbine model is initialized, the parameter updating unit 220 may periodically acquire updated wind turbine model parameters, based on the current environment condition and the wind turbine's current actual wind turbine state parameters, as the wind turbine model parameters for the current period. As a result, the wind turbine model may be kept accurate and the historical wind turbine model parameters and the corresponding historical environment condition thereof may be collected.

In each period, the parameter updating unit 220 acquires the current environment condition and the wind turbine's current actual wind turbine state parameters, thereby determining wind turbine model parameters for each period in a case where the initial input and the expected output of the wind turbine model are determined.

The updated wind turbine model parameters enable the wind turbine state parameter outputted by the wind turbine model into which the current environment condition is inputted to be as close to the current actual wind turbine state parameters as possible.

In a preferable embodiment, the variation of the wind turbine model parameters is further considered when updating the wind turbine model parameters in each period. In this case, during each period, the updated wind turbine model parameters enable the wind turbine state parameters outputted by the wind turbine model into which the current environment condition is inputted to be as close to current actual wind turbine state parameters as possible, meanwhile, the weighted result of the variation of the updated wind turbine model parameters relative to the last updated wind turbine model parameters (i.e. the wind turbine model parameters updated in the last period) is as small as possible. Herein, the sum of the absolute values or the even powers of the difference values between each updated wind turbine model parameter and each last updated wind turbine model parameter with the same type may be calculated as the variation (it should be understood that in a case where the wind turbine model only has one (i.e. one type) wind turbine model parameter, the sum mentioned above is the absolute value or the even power of the difference value of the wind turbine model parameters of the type). The weights used for weighting may be acquired empirically or experimentally. For example, the wind turbine model parameters enabling the sum of "the variation of the wind turbine state parameters outputted by the wind turbine model into which the current environment condition is inputted with respect to the current actual wind turbine state parameters" and "the weighted result of the variation of the updated wind turbine model parameters relative to the last updated wind turbine model parameters" to be minimized may be acquired as the updated wind turbine model parameters.

In the preferable embodiment, the updated wind turbine model parameters are acquired through the above formula (2).

The parameter modeling unit 230 establishes a variation model of the wind turbine model parameters based on historical wind turbine model parameters and corresponding historical environment conditions.

The variation model of the wind turbine model parameters represents the relationship between the environment conditions and the wind turbine model parameters. In the embodiment of the present application, when inputting the environment condition into the variation model of the wind turbine model parameters, the variation model of the wind turbine model parameters may estimate and output the corresponding wind turbine model parameters. Based on the historical wind turbine model parameters and the corresponding historical environment conditions, the variation model of the wind turbine model parameters may be established by using various modeling technologies, which are not limited herein, as long as the established variation model of the wind turbine model parameters may represents the interrelation between the environment conditions and the wind turbine model parameters.

In an embodiment, the variation model of the wind turbine model parameters is established by fitting with the historical wind turbine model parameters and the corresponding historical environment conditions. The variation model of the wind turbine model parameters may be fit out through various fitting methods. Moreover, the structure of the variation model of the wind turbine model parameters may be acquired through fitting (in this case, the structure and the parameters of the variation model of the wind turbine model parameters are determined through fitting) or may be predetermined (in this case, only the parameters of the variation model of the wind turbine model parameters are determined through fitting). In a preferable embodiment, the variation model of the wind turbine model parameter is expressed as the above formula (3).

The historical wind turbine model parameters and the corresponding historical environment conditions may be acquired based on the parameter updating unit 220. The historical wind turbine model parameters and the corresponding historical environment conditions may represent the wind turbine model parameters and the corresponding environment conditions in the past time acquired by the parameter updating unit 220 or all of the wind turbine model parameters and the corresponding environment conditions acquired by the initialization unit 210 and parameter updating unit 220.

The parameter prediction unit 240 uses the variation model of the wind turbine model parameters to predict the wind turbine model parameters at the future moment based on the future environment condition at the future moment.

In a case where it is expected to predict the fault of the wind turbine at the future moment (i.e. sometime in the future), the parameter prediction unit 240 may acquire the environment condition at the future moment (hereinafter, it is called future environment condition) and input the acquired future environment condition into the variation model of the wind turbine model parameters to predict the wind turbine model parameters at the future moment.

The environment condition at the future moment may be acquired through various methods, such as weather forecasts, environmental models, etc. The present application does not limit the method for acquiring the environment condition at the future moment.

The fault modeling unit 250 establishes a wind turbine fault model based on the historical wind turbine model parameters and the corresponding historical wind turbine faults. The wind turbine fault model represents the relationship between the wind turbine model parameters and the wind turbine faults. In the embodiment of the present application, when inputting the wind turbine model parameters into the wind turbine fault model, the wind turbine fault model may estimate and output the corresponding wind turbine fault.

The wind turbine fault model may be established by using various modeling technologies based on the historical wind turbine model parameters and the corresponding historical wind turbine faults, which is not limited in the present application, as long as the established wind turbine fault model may represents the relationship between the wind turbine model parameters and the wind turbine faults.

When the wind turbine fails, the wind turbine model parameters of the current wind turbine model are acquired, thereby obtaining the historical wind turbine model parameters and the corresponding historical wind turbine fault. In the embodiment of the present application, "the historical wind turbine fault" indicates whether a fault has happened. In this case, the acquired wind turbine fault model may output information indicating whether a fault has happened based on the inputted wind turbine model parameters. For example, the wind turbine model parameters may be used as a feature and whether a fault has happened is taken as a classification tag, and the historical wind turbine model parameters and the corresponding historical wind turbine faults are used as training samples to train a classifier to be the wind turbine fault model. As the result, the wind fault model is the classifier with the features of the wind turbine model parameters and the classification tag of whether the fault has happened.

Moreover, when the wind turbine fails, fault type may be acquired. In the embodiment of the present application, "the historical wind turbine fault" herein may indicate the fault type. In this case, if the fault is predicted, the wind turbine fault model may output information indicating the type of the happened fault. For example, the wind turbine model parameters may be used as the feature and the fault type may be used as the classification tag, the historical wind turbine model parameters and the corresponding historical wind turbine faults are used as training samples to train a classifier to be the wind turbine fault model. As the result, the wind turbine fault model is the classifier with the feature of the wind turbine model parameters and the classification tag of the fault type.

Preferably, the historical wind turbine model parameters and the corresponding historical wind turbine faults used in establishing the wind turbine fault model may be the historical wind turbine model parameters and the corresponding historical wind turbine faults which have been collected so far when predicting the wind turbine fault each time.

The fault prediction unit 260 predicts the wind turbine fault at the future moment based on the predicted wind turbine model parameters and the wind turbine fault model.

After the wind turbine model parameters at the future moment have been acquired by the parameter prediction unit 240, the acquired wind turbine model parameters are inputted into the established wind turbine fault model, so that the wind turbine fault model predicts the wind turbine fault at the future moment. Based on the different wind turbine fault models mentioned above, the predicted fault may only indicate whether the fault has happened or the type of the fault.

According to the method and device for predicting the wind turbine fault provided according to the present application, the relation of environmental factors and the wind turbine is taken into account when predicting the wind turbine fault. The wind turbine model is established based on the influence of the environmental factors. Meanwhile, the wind turbine model parameters are updated constantly to obtain the historical wind turbine model parameters, thereby establishing the wind turbine fault model related to the wind turbine model parameters, to predict the fault, thereby predicting the wind turbine fault more accurately.

Moreover, a system for predicting a wind turbine fault is provided according to the present application. The system includes: a processor and a memory, where the memory stores computer-readable codes. When the computer-readable codes are executed by the processor, the processor is configured to perform the method for predicting the wind turbine fault.

Besides, the above method in the exemplary embodiments of the present application can be realized to be a computer program stored on a computer readable medium, thereby realizing the above method for predicting the wind turbine fault when running the program.

Moreover, each of the units in the above device according to the exemplary embodiment of this application can be implemented as a hardware component or a software module. In addition, those skilled in the art can implement the hardware components by using field programmable gate array (FPGA), application-specific integrated circuit (ASIC), processor and the like based on the process performed by each unit, and implement the software modules by programming technology.

The present application is displayed and described with reference to exemplary embodiments, but those skilled in the art should understand, variations of forms and details may be made by those skilled in the art without departing from the spirit and the scope of the present disclosure limited in the claims.

The invention claimed is:

1. A method for predicting a fault of a wind turbine, comprising:
   initializing a wind turbine model of the wind turbine;
   updating wind turbine model parameters of the wind turbine model based on a current environment condition and current actual wind turbine state parameters of the wind turbine periodically;
   establishing a variation model of the wind turbine model parameters based on historical wind turbine model parameters and corresponding historical environment conditions;
   predicting wind turbine model parameters at a future moment by using the variation model of the wind turbine model parameters based on a future environment condition at the future moment;
   establishing a wind turbine fault model based on the historical wind turbine model parameters and corresponding historical wind turbine faults; and
   predicting the fault of the wind turbine at the future moment based on the predicted wind turbine model parameters and the wind turbine fault model.

2. The method according to claim 1, wherein the wind turbine model reflects a relationship between environment conditions and wind turbine state parameters, the variation model of the wind turbine model parameters reflects a relationship between the environment conditions and the wind turbine model parameters, the wind turbine fault model reflects a relationship between the wind turbine model parameters and the fault of the wind turbine.

3. The method according to claim 1, wherein initializing the wind turbine model of the wind turbine comprises:
   determining initial wind turbine model parameters based on an initial environment condition and initial actual wind turbine state parameters.

4. The method according to claim 3, wherein the initial wind turbine model parameters enable wind turbine state parameters outputted by the wind turbine model into which the initial environment condition is inputted to be as close to the initial actual wind turbine state parameters as possible.

5. The method according to claim 4, wherein the initial wind turbine model parameters enable the wind turbine state parameters outputted by the wind turbine model into which the initial environment condition is inputted to be as close to the initial actual wind turbine state parameters as possible, and a weighted result of a total value of the initial wind turbine model parameters is as small as possible.

6. The method according to claim 5, wherein the total value of the initial wind turbine model parameters is a sum of absolute values of each initial wind turbine model parameter, or a sum of even powers of each initial wind turbine model parameter.

7. The method according to claim 1, wherein updating wind turbine model parameters of the wind turbine model comprises:
   acquiring the updated wind turbine model parameters based on the current environment condition and the current actual wind turbine state parameters of the wind turbine periodically, wherein the updated wind turbine model parameters enable wind turbine state parameters outputted by the wind turbine model into which the current environment condition is inputted to be as close to the current actual wind turbine state parameters as possible.

8. The method according to claim 7, wherein the updated wind turbine model parameters enable the wind turbine state parameters outputted by the wind turbine model into which the current environment condition is inputted to be as close to the current actual wind turbine state parameters as possible, and, a weighted result of the variation of the updated wind turbine model parameters relative to the last updated wind turbine model parameters is as small as possible, and wherein a sum of absolute values or even powers of difference values between each updated wind turbine model parameter and each last updated wind turbine model parameter of the same type is calculated as the variation.

9. The method according to claim 1, wherein establishing the variation model of the wind turbine model parameters comprises:
   establishing the variation model of the wind turbine model parameters by fitting with the historical wind turbine model parameters and the corresponding historical environment conditions, wherein the variation model of the wind turbine model parameter is expressed as follows:

$$\theta_T = A \cdot \theta_{T-1} + B \cdot x_T$$

wherein $\theta_T$ represents wind turbine model parameters at time T, $\theta_{T-1}$ represents wind turbine model parameters at time T−1, A is a state-transition matrix of the wind turbine model parameters, B is an influence-coefficient-matrix of environment conditions on the wind turbine model parameters, $x_T$ is an environment condition at the time T, and the time represents a time after the time T.

10. The method according to claim 1, wherein the wind fault model is a classifier with a feature of the wind turbine model parameters and a classification tag of whether the fault has happened or a type of the fault.

11. A system for predicting a fault of a wind turbine, comprising:
a processor; and
a memory, storing computer-readable codes that, when executed by the processor, configures the processor to perform the method according to claim 1.

12. A device for predicting a fault of a wind turbine, comprising:
an initialization unit, configured to initialize a wind turbine model of the wind turbine;
a parameter updating unit, configured to update wind turbine model parameters of the wind turbine model based on a current environment condition and current actual wind turbine state parameters of the wind turbine periodically;
a parameter modeling unit, configured to establish a variation model of the wind turbine model parameters based on historical wind turbine model parameters and corresponding historical environment conditions;
a parameter prediction unit, configured to predict wind turbine model parameters at a future moment by using the variation model of the wind turbine model parameters based on a future environment condition at the future moment;
a fault modeling unit, configured to establish a wind turbine fault model based on the historical wind turbine model parameters and corresponding historical wind turbine faults; and
a fault prediction unit, configured to predict the fault of the wind turbine at the future moment based on the predicted wind turbine model parameters and the wind turbine fault model.

13. The device according to claim 12, wherein the wind turbine model reflects a relationship between environment conditions and wind turbine state parameters, the variation model of the wind turbine model parameters reflects a relationship between the environment conditions and the wind turbine model parameters, the wind turbine fault model reflects a relationship between the wind turbine model parameters and the fault of the wind turbine.

14. The device according to claim 12, wherein the initialization unit determines initial wind turbine model parameters based on an initial environment condition and initial actual wind turbine state parameters.

15. The device according to claim 14, wherein the initial wind turbine model parameters enable wind turbine state parameters outputted by the wind turbine model into which the initial environment condition is inputted to be as close to the initial actual wind turbine state parameters as possible.

16. The device according to claim 15, wherein the initial wind turbine model parameters enable the wind turbine state parameters outputted by the wind turbine model into which the initial environment condition is inputted to be as close to the initial actual wind turbine state parameters as possible, and, a weighted result of a total value of the initial wind turbine model parameters is as small as possible.

17. The device according to claim 16, wherein the total value of the initial wind turbine model parameters is a sum of absolute values of each initial wind turbine model parameter, or a sum of even powers of each initial wind turbine model parameter.

18. The device according to claim 12, wherein the parameter updating unit acquires the updated wind turbine model parameters, based on the current environment condition and the current actual wind turbine state parameters of the wind turbine periodically, wherein the updated wind turbine model parameters enable wind turbine state parameter outputted by the wind turbine model into which the current environment condition is inputted to be as close to the current actual wind turbine state parameters as possible.

19. The device according to claim 18, wherein the updated wind turbine model parameters enable the wind turbine state parameters outputted by the wind turbine model into which the current environment condition is inputted to be as close to the current actual wind turbine state parameters as possible, and, a weighted result of the variation of the updated wind turbine model parameters relative to the last updated wind turbine model parameters is as small as possible, and
wherein a sum of absolute values or even powers of difference values between each updated wind turbine model parameter and each last updated wind turbine model parameter of the same type is calculated as the variation.

20. The device according to claim 12, wherein the parameter modeling unit establishes the variation model of the wind turbine model parameters by fitting with the historical wind turbine model parameters and the corresponding historical environment condition,
wherein the variation model of the wind turbine model parameter is expressed as follows:

$$\theta_T = A \cdot \theta_{T-1} + B \cdot x_T$$

wherein $\theta_T$ represents wind turbine model parameters at time T, $\theta_{T-1}$ represents wind turbine model parameters at time T−1, A is a state-transition matrix of the wind turbine model parameters, B is an influence-coefficient-matrix of environment conditions on the wind turbine parameters, $x_T$ is an environment condition at the time T, and the time T−1 represents a time after the time T.

* * * * *